United States Patent [19]

Feth et al.

[11] 4,254,428
[45] Mar. 3, 1981

[54] SELF-ALIGNED SCHOTTKY DIODE STRUCTURE AND METHOD OF FABRICATION

[75] Inventors: George C. Feth, Yorktown Heights, N.Y.; Siegfried K. Wiedmann, Stuttgart, Fed. Rep. of Germany

[73] Assignee: International Business Machines Corporation, Armonk, N.Y.

[21] Appl. No.: 108,073

[22] Filed: Dec. 28, 1979

[51] Int. Cl.³ ............................................ H01L 29/48
[52] U.S. Cl. ...................................... 357/15; 357/49; 357/59
[58] Field of Search ............................. 357/15, 59, 49

[56] References Cited

U.S. PATENT DOCUMENTS

| | | | |
|---|---|---|---|
| 4,159,915 | 7/1979 | Anantha et al. | 357/15 |
| 4,175,521 | 11/1979 | Neale | 357/15 |

*Primary Examiner*—Joseph E. Clawson, Jr.
*Attorney, Agent, or Firm*—John J. Goodwin

[57] ABSTRACT

A Schottky diode structure and self-aligned fabrication method wherein the cathode or ohmic contact is disposed in the center of the anode or Schottky contact and is isolated therefrom by an overlapping layer of insulation. This structure has a reduced area size; it allows the use of only one metal line for both anode contacts and affords a marked advantage of device density. The structure includes a substrate having an n+ sub-diffusion therein, an epitaxial layer over the sub-diffusion which serves as the cathode electrode of the Schottky barrier device, and recessed oxide regions on the substrate for isolation. A heavily doped n+ polysilicon layer is disposed over the epitaxial layer and is used as a source of impurities for the diffusion which makes contact to the Schottky barrier diode. The structure is masked and exposed by conventional photolithographic or electron-beam techniques and is etched down to the epitaxial layer leaving a strip of n+ polysilicon. This strip is employed to connect to the cathode of the Schottky barrier diode and to interconnect it to other devices. A silicon dioxide layer is then grown over the surface of the epitaxial layer and polysilicon and/or deposited over the whole surface by chemical vapor deposition. A reactive-ion-etching step is then performed to remove the oxide layer back to the surface of the epitaxial layer. This leaves a silicon dioxide layer remaining on the top and sides of the polysilicon strip. An n+ region is out-diffused from highly doped region into the epitaxial layer and Schottky barrier diode anode material, for example palladium silicide, is deposited as a film layer of metallic palladium, then is reacted with silicon at high temperature, and the unreacted metal over the silicon dioxide is selectively etched away leaving behind the reacted palladium silicide anode regions. Finally, a metal layer is deposited for contacting the Schottky barrier diode anode and is patterned for interconnection to other devices.

7 Claims, 9 Drawing Figures

SELF-ALIGNED SCHOTTKY DIODE STRUCTURE AND METHOD OF FABRICATION

DESCRIPTION

1. Technical Field

The present invention is in the technical field of semiconductor devices of the Schottky diode type having an ohmic contact and a Schottky contact and relates to the field of fabrication of such devices using self-alignment techniques.

In conventional Schottky diode structures the active device area is bounded by oxide regions, and the cathode, or ohmic contact and the anode or Schottky contact are disposed side-by side in the bounded active device area and are separated by an oxide strip. Two metal lines are used for the ohmic contact and the Schottky contact respectively. In such configuration the active device area is relatively large and therefore its resultant parasitic stray capacitance is correspondingly large and it is difficult to realize a compact circuit layout configuration.

The present invention provides a Schottky diode structure and self-aligned fabrication method wherein the cathode or ohmic contact is disposed in the center of the anode or Schottky contact and is isolated therefrom by an overlapping layer of insulation. This structure has a reduced area size; it allows the use of only one metal line for both anode contacts and affords a marked advantage of device density.

2. Background Art

U.S. Pat. No. 3,708,360 issued Jan. 2, 1973 to R. H. Wakefield, Jr. et al, entitled SELF-ALIGNED GATE FIELD EFFECT TRANSISTOR WITH SCHOTTKY BARRIER DRAIN AND SOURCE. This patent is a typical example of a Schottky barrier field effect-transistor wherein the Schottky contacts are disposed adjacent to the gate contact and two separate metal lines are required.

U.S. Pat. No. 3,912,546 issued Oct. 14, 1975 to Hunspeger et al, entitled ENHANCEMENT MODE, SCHOTTKY-BARRIER GATE GALLIUM ARSENIDE FIELD EFFECT TRANSISTOR is another example of a device as just described.

U.S. Pat. No. 3,866,310 issued Feb. 18, 1975 to Driver et al, entitled METHOD FOR MAKING THE SELF-ALIGNED GATE CONTACT OF A SEMICONDUCTOR DEVICE is mentioned because it relates to a form of self-alignment process for a Schottky barrier gate contact.

The IBM JOURNAL OF RESEARCH AND DEVELOPMENT, Vol. 14, No. 2, is of interest in that the issue is devoted to publications on prior art Schottky field effect transistors.

The aforesaid references do not describe structures or fabrication methods for a Schottky diode wherein the ohmic contact is disposed within the Schottky contact and which employs a single metal line for both anode contacts resulting in a device having a very small area.

BRIEF DESCRIPTION OF THE DRAWINGS

FIGS. 2-1, 2-2, 2-3 and 2-4 are schematic elevation drawings illustrating a series of fabrication steps for forming a self-aligned Schottky diode structure according to the principles of the present invention.

FIGS. 3-1 and 3-2 are schematic drawings illustrating the side view and top view respectively of a self-aligned Schottky diode structure according to the principles of the present invention and fabricated according to the method steps illustrated in FIGS. 2-1 through 2-4.

DISCLOSURE OF THE INVENTION

Figure 1:
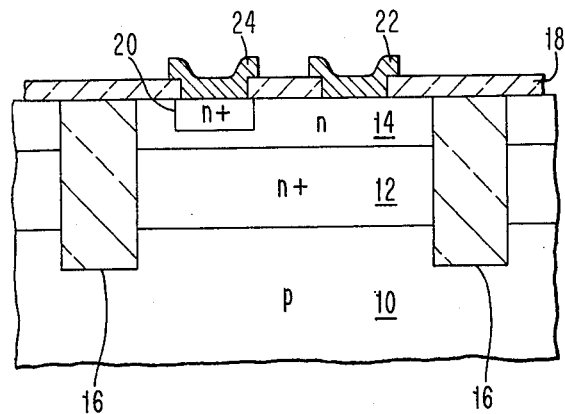
FIGS. 1-1, 1-2 and 1-3 are schematic drawings which illustrate the side view, top view and equivalent circuit respectively of a typical prior art Schottky diode structure.
Figures 1, 2:
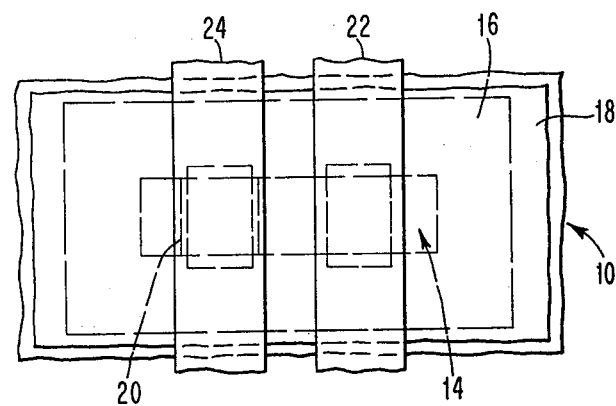

An understanding of the structure and fabrication method of the present invention can be more effectively obtained by a consideration of a typical prior art structure. FIGS. 1-1 and 1-2 illustrate respectively the side and top views of such prior art Schottky diode structure.

In FIG. 1-1 a substrate 10 is provided, and is composed, for example, of single-crystal p-type silicon. An n+ region 12 is formed in substrate 10 by a diffusion of donors at high concentration, for example about $10^{20}/cm^3$, into p substrate 10 to form a high-conductivity layer sometimes referred to as a subcollector. However, in mergedtransistor-logic, where the npn transistors inject upward and have emitters on the bottom, region 12 is more accurately a sub-emitter diffusion or, as will be referred to hereinafter, a sub-diffusion. Sub-diffusion 12 may be formed of arsenic, phosphorus, or other equivalent doping donors, with arsenic preferred because it diffuses slower than phosphorus in subsequent heat cycles.

An epitaxial layer 14 is then grown over the subdiffusion 12, epitaxial layer 14 being lightly doped with n donors. During the growth of layer 14 and during hot processing the dopant from sub-diffusion 12 out diffuses to some extent into the epitaxial layer 14. Thus, layer 14 is only a portion of the whole thickness of the epitaxial layer and region 12 is thicker than the original sub-diffusion, lying partly within the original substrate 10 and partly within the epitaxial layer 14. The epitaxial layer 14 serves as the cathode electrode of the Schottky barrier diode.

Silicon dioxide regions 16 are formed by etching into and/or through the original regions 14, 12 and 10 and then forming oxide in the exposed regions. Regions 16 are referred to as "recessed oxide" or "ROX". Regions 16 are used to isolate the active semiconductor regions 12 and 14 from neighboring regions of the same layers at the sides; isolation at the bottom is provided by the reverse biased n+ p junction between layer 12 and substrate 10. Insulating silicon dioxide $SiO_2$ layer 18 is grown on the silicon surface by dry and/or wet oxidation and it is used as a mask for subsequent contact hole definition and as an insulator for overlying conductors.

Element 20 is an n+ diffused contact to layer 14; it is located and defined by the lithographically-defined contact hole through $SiO_2$ layer 18. It serves to contact the cathode layer 14 of the Schottky barrier diode.

Element 22 is the anode electrode of the Schottky barrier diode, and it is composed of an appropriate metal such as palladium, platinum, chromium, molybdenum, tungsten, aluminum, or the like, or an appropriate metal silicide, e.g., platinum silicide or palladium silicide, and is used for providing the desired Schottky barrier with the lightly doped region 14. A composite metal may be used, for example a paladium or platinum contact layer with an aluminum metallization overlay.

Element 24 is a metal to semiconductor contact, usually employing the same metallurgy as electrode 22 for convenience, but for purposes of making an ohmic contact with the highly doped region 20.

Figures 1, 2, 3:
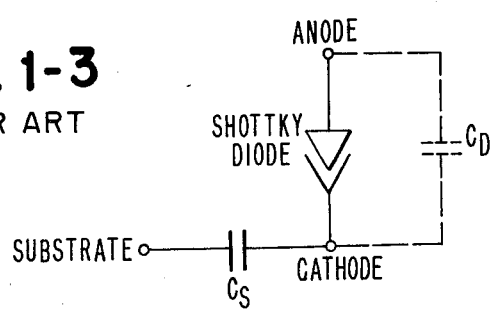

FIG. 1-2 is a plan view of the prior art structure illustrated in the side view of FIG. 1-1, and FIG. 1-3 is a schematic circuit illustrating the relationship of the Schottky diode and the substrate, where $C_S$ is the parasitic capacitance from the cathode to the substrate and neighboring regions and $C_D$ is the parasitic shunt capacitance of the diode.

The process steps for fabricating an improved self-aligned Schottky diode structure according to the present invention are illustrated in FIG. 2-1 through 2-4. In FIG. 2-1 an initial structure is provided including substrate 10, an n+ sub-diffusion 12, an epitaxial layer 14 which serves as the cathode electrode of the Schottky barrier device, and recessed oxide regions 16 for isolation, all analogous to the prior art.

In FIG. 2-2, a distinction over the prior art of FIGS. 1-1 and 1-2 is provided in n+ layer 30, which is composed, for example, of heavily doped n+ polysilicon having a concentration about $10^{20}$ atoms/cm$^3$ or higher, and which is used as a source of impurities for the diffusion which makes contact to the Schottky barrier diode. Layer 30 may also be reacted with a refractory metal to provide a silicide with higher conductivity than attainable with polysilicon alone, assuming that processing is compatible with that of the rest of the structure. Next, a layer 18 of silicon dioxide $SiO_2$ is grown and/or deposited onto layer 30 for insulating layer 30 as well as for masking subsequent etching steps.

The structure is then masked and exposed by conventional photolithographic or electron-beam techniques and is etched down to the epitaxial layer 14 leaving a strip of n+ polysilicon 32 remaining from layer 30, as shown in FIG. 2-3. This strip 32 will be employed to connect to the cathode of the Schottky barrier diode and to interconnect it to other devices. A silicon dioxide $SiO_2$ layer 34 is then grown over the surfaces of the epitaxial layer 14 and polysilicon 32 and/or deposited over the whole surface by chemical vapor deposition.

Figures 1, 2:
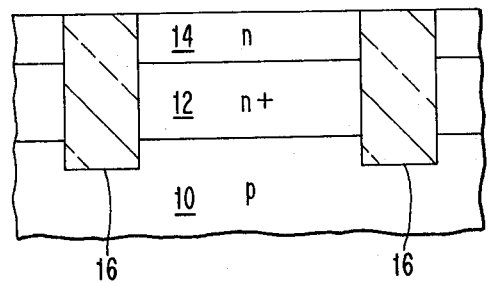
Figure 2:
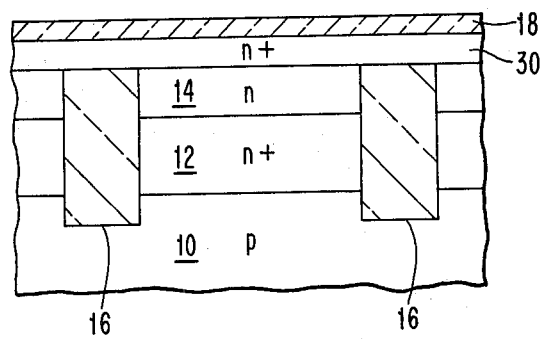
Figures 2, 3:
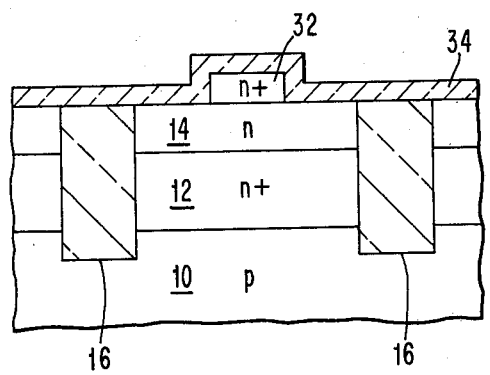
Figures 2, 3, 4:
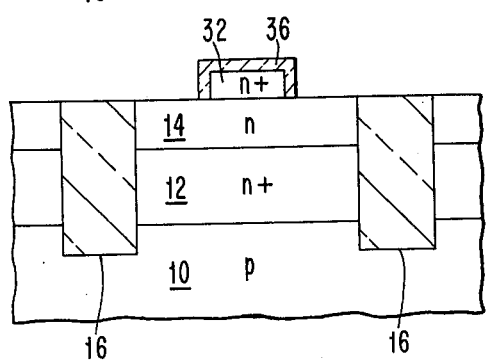
Figures 1, 3:
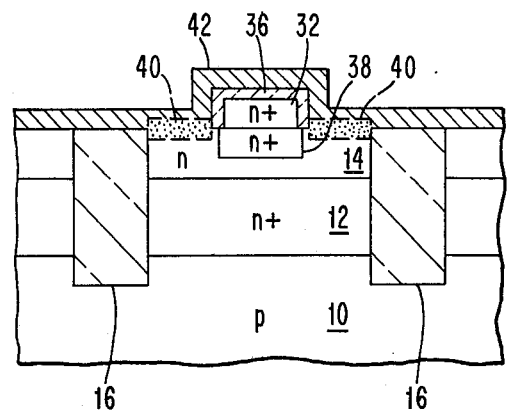
Figures 2, 3:
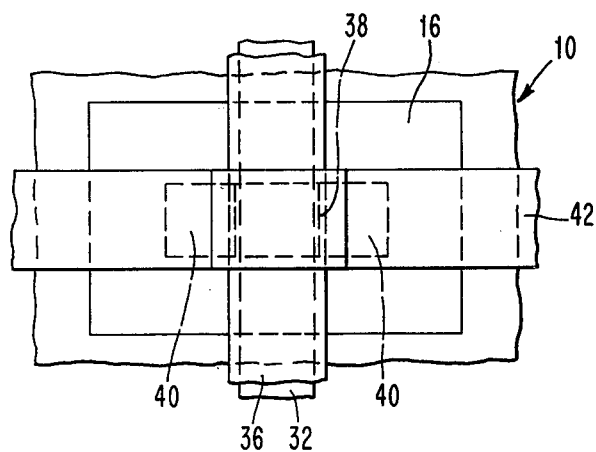

A reactive-ion-etching step is then performed to remove oxide layer 34 back to the surface of the epitaxial layer 14 as shown in FIG. 2-4. This leaves a silicon dioxide layer 36 remaining on the top and sides of the polysilicon strip 32. The oxide 36 remains on the top of polysilicon 32 because it was initially thicker there, being composed of the original layer 18 and the deposited layer 34. The oxide 36 remains on the sides of polysilicon 32 because the deposition is conformal, whereas the removal by reactive-ion-etching is vertically directional and does not remove the silicon dioxide from the sidewalls.

FIG. 3-1 illustrates a side elevation view of the completed device wherein an n+ region 38 is outdiffused from highly doped region 32 into the epitaxial layer 14. (If desired, depending on other devices being fabricated at the same time, region 38 could reach through to layer 12.) Region 38 serves, together with region 32, as the contact to cathode region 14.

Schottky barrier diode anode material, for example palladium silicide $Pd_2Si$, is deposited as a film layer of metallic palladium Pd, then is reacted with silicon at high temperature, and the unreacted metal over the silicon dioxide is selectively etched away leaving behind the reacted $Pd_2Si$ anode regions 40. It should be noted that by this step the Schottky anode regions 40 are self-aligned with the cathode contact region 38.

Finally, a metal layer 42, for example aluminum, is deposited for contacting the Schottky barrier diode anode 40 and is patterned for interconnection to other devices.

FIG. 3-2 shows the top view of the structure of FIG. 3-1. FIG. 3-2 illustrates the unique aspect of the cathode contact regions 38 and 32 disposed between the contacts to the Schottky anode regions 40 and isolated from the overlying metal connection to the Schottky contacts by the layer of silicon dioxide 36 shown in FIG. 3-1. Only one metal line 42 is required for both Schottky contacts, and the capability for the conductors which contact the anode and cathode to cross each other is implicit in the structure and contributes to wiring flexibility. Moreover, the physical separation between anode and cathode is determined by the non-critical thickness of the oxide on the sidewalls of the n+ polysilicon region 32 as a favorable result of the self-aligned nature of this device, and it is much smaller than the photolithographically determined minimum dimension for a contact hole required in the prior art.

Furthermore, the lateral extent of the anode contact regions 40 may well be less than a photolithographic minimum dimension, as required in the prior art; in this invention it is not mandatory that the anode contact be made on both sides of the device, and so the total width of region 38 must simply be sufficient to include the width of n+ polysilicon region 32, its sidewall oxide layers, and sufficient width of region 40 to assure adequate contact area for the designed current level under the worst case dimensional tolerances and mask alignment tolerances on the $SiO_2$ isolation regions 16 and the n+ polysilicon region 32. The result of all this is that the subject invention provides a structure having a much smaller area size than that of FIGS. 1-1 and 1-2, as well as greater wiring flexibility and dimensions compatible with a very dense and regular orthogonal-grid layout of logic gates or memory cells and interconnections.

INDUSTRIAL APPLICABILITY

The general application of Schottky-barrier diodes in the semiconductor industry is well know. The Schottky-barrier diode structure according to the present invention provides features which further enhance utility. One of the embodiments of the present invention is the n-type Schottky barrier diode structure described. The n-type Schottky barrier diode may be more effectively incorporated into merged transistor logic (MTL) devices in large scale integration (LSI) applications. The n-type Schottky barrier diode, in such application, limits logic swing and produces better power-delay products thereby. Furthermore, the small device size resulting from locating the device cathode contact in between the anodes using self-alignment techniques as taught in the present invention makes possible very small lateral spacing between adjacent devices, interconnection tracks and/or base connections. Likewise, very small vertical spacing is also realized with lateral connections possible from both ends of each MTL gate beneath the power and ground rails to nearby devices in the next column of gates. Thus, a very dense layout with easy wirability is provided by the use of the present invention.

While the invention has been particularly shown and described with reference to a preferred embodiment thereof, it will be understood by those skilled in the art that the foregoing and other changes in form and details may be made therein without departing from the spirit and scope of the invention.

Having thus described our invention, what we claim as new, and desire to secure by Letters Patent is:

1. A Schottky-barrier diode structure comprising:
   a semiconductor substrate;
   a doped subdiffusion layer of relatively high conductivity disposed on said substrate;
   a layer of epitaxial material of relatively low conductivity disposed on said subdiffusion layer;
   an insulating region of recessed oxide disposed in said structure and extending down into said epitaxial layer, into said subdiffusion layer and into said substrate to form a recessed oxide isolation region surrounding an area of said subdiffusion layer and said epitaxial layer to define a perimeter, the interior area of said perimeter bounded by said recessed oxide being the active device area of said Schottky-barrier diode structure, and wherein said layer of epitaxial material in said active device area functions as the cathode electrode of said Schottky-barrier diode structure;
   a body of relatively highly doped polysilicon located on top of and in the center of said layer of epitaxial material in said active device area surrounded by said recessed oxide;
   an insulating layer of oxide material disposed on the top and sides of said body of relatively highly doped polysilicon;
   a diffusion region located below said body of highly doped polysilicon and extending into said layer of epitaxial material, said body of highly doped polysilicon and said diffusion region therebelow functioning as an electrical cathode contact for said epitaxial layer cathode electrode; and first and second regions of Schottky-barrier diode anode material disposed in said epitaxial layer in said active device area on either side of said body of polysilicon material, said first and second regions of said Schottky-barrier diode anode material being bounded by said recessed oxide and said oxide on the sides of said body of polysilicon material to form a Schottky-barrier diode structure wherein said cathode contact is disposed in between said anode contacts and is isolated from said anode contacts by said oxide insulation on the sides thereof.

2. A Schottky-barrier diode structure according to claim 1 further including a metallic line disposed over the surface of said recessed oxide, said Schottky-barrier anode material and said oxide covered body of polysilicon material.

3. A Schottky-barrier diode structure according to claim 1 wherein said semiconductor substrate is composed of silicon, said recessed oxide is silicon dioxide and said oxide insulation of the top and sides of said body of polysilicon is silicon dioxide.

4. A Schottky-barrier diode structure according to claim 3 wherein said Schottky-barrier diode anode material is palladium silicide.

5. A Schottky-barrier diode structure according to claim 3 wherein said substrate is composed of p-type silicon and said subdiffusion layer on said body of polysilicon material are doped with n+ donors.

6. A Schottky-barrier diode structure according to claim 5 wherein said subdiffusion layer is doped with arsenic donors.

7. A Schottky-barrier diode structure according to claim 5 wherein said subdiffusion layer is doped with phosphorus donors.

* * * * *